(12) United States Patent
Huang et al.

(10) Patent No.: US 6,673,684 B1
(45) Date of Patent: Jan. 6, 2004

(54) USE OF DIAMOND AS A HARD MASK MATERIAL

(75) Inventors: Richard J. Huang, Cupertino, CA (US); Philip A. Fisher, Foster City, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/335,726

(22) Filed: Jan. 2, 2003

Related U.S. Application Data
(60) Provisional application No. 60/399,768, filed on Jul. 31, 2002.

(51) Int. Cl.[7] ............................................. H01L 21/336
(52) U.S. Cl. ........................................................ 438/299
(58) Field of Search ................................. 438/299, 197, 438/684, 694–699, 734–736

(56) References Cited

U.S. PATENT DOCUMENTS

| 5,185,293 A | 2/1993 | Franke et al. |
| 5,656,128 A | 8/1997 | Hashimoto et al. |
| 5,759,746 A | 6/1998 | Azuma et al. |
| 6,346,747 B1 * | 2/2002 | Grill et al. .................. 257/752 |
| 6,368,924 B1 | 4/2002 | Mancini et al. |
| 6,388,924 B1 | 5/2002 | Nasu |
| 2002/0048959 A1 * | 4/2002 | Clevenger et al. .......... 438/692 |

OTHER PUBLICATIONS

Sumitomo Derwent Abstracted Publication No. JP 63220524A "Etching diamond semiconductor . . . " Sep. 13, 1988 (abstract only).*

* cited by examiner

Primary Examiner—Craig A. Thompson
(74) Attorney, Agent, or Firm—Foley & Lardner

(57) ABSTRACT

A method for producing an integrated circuit includes providing a diamond layer above a layer of conductive material. A cap layer is provided above the diamond layer and patterned to form a cap feature. The diamond layer is patterned according to the cap feature to form a mask, and at least a portion of the layer of conductive material is removed according to the mask.

20 Claims, 5 Drawing Sheets

USE OF DIAMOND AS A HARD MASK MATERIAL

CROSS-REFERENCE TO RELATED PATENT APPLICATIONS

This application claims the benefit of U.S. provisional application No. 60/399,768, filed Jul. 31, 2002, which is incorporated by reference herein in its entirety. This application is related to U.S. patent application Ser. No. 10/215,173 entitled "Use of Amorphous Carbon Hard Mask for Gate Patterning to Eliminate Requirement of Poly Re-Oxidation," U.S. patent application Ser No. 10/277,760 entitled "Sacrificial Air Gap Layer for Insulation of Metals," U.S. patent application Ser. No. 10/244,650 entitled "Use of Multilayer Amorphous Carbon Hard Mask to Eliminate Line Warpage Phenomenon," U.S. patent application Ser. No. 10/424,420 entitled "Use of Amorphous Carbon for Gate Patterning," U.S. patent application Ser. No. 10/230,794 entitled "Formation of Amorphous Carbon ARC Stack Having Graded Transition Between Amorphous Carbon and ARC Material," U.S. patent application Ser. No. 10/217,730 entitled "Ion Implantation To Modulate Amorphous Carbon Stress," U.S. patent application Ser. No. 10/424,675 entitled "Selective Stress-Inducing Implant and Resulting Pattern Distortion in Amorphous Carbon Patterning," U.S. Patent Application Ser. No. 10/230,775 entitled "Use of Buffer Dielectric Layer with Amorphous Carbon Mask to Reduce Line Warpage," and U.S. patent application Ser. No. 10/445,129 entitled "Modified Film Stack and Patterning Strategy for Stress Compensation and Prevention of Pattern Distortion in Amorphous Carbon Gate Patterning," each of which is assigned to the assignee of the present application.

FIELD OF THE INVENTION

The present invention relates generally to the field of integrated circuits and methods of manufacturing integrated circuits. More particularly, the present invention relates to the use of masks formed of diamond to form features in integrated circuits.

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors (e.g., MOSFETs), are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

As critical dimensions (CDs) of device structures are made smaller, certain issues must be addressed during processing. One such issue involves the use of a wet etch to remove mask layers used in the formation of the structures. When structures having small critical dimensions are produced, the introduction of phosphoric acid or other aqueous etchants to remove a mask layer may damage the structure formed during the etching process.

Another issue that must be addressed is that the shape integrity of the structures formed may be lessened where the materials used to form the mask layer include an internal stress. For example, where a mask material includes an internal compressive or tensile stress by virtue of the microstructure of the material, under certain conditions the mask material may deform. The deformed mask layer will then transfer the deformed pattern into the underlying material when the mask is used during an etch or material removal step. This phenomenon is sometimes referred to as line warpage or "wiggle." For example, conductive lines formed that exhibit warpage or wiggle characteristics may appear as a serpentine or curving structure. The warpage or wiggle of the line may increase the distance that electrons must travel through the conductive line (and hence increase the resistance of the conductive line) when compared to conductive lines that do not exhibit warpage or wiggle characteristics.

A further issue that must be addressed involves reducing the overall thermal budget of the integrated circuit manufacturing process. Certain materials used to form masks for producing device features (e.g., conductive lines, gates, etc.) must be deposited at elevated temperatures. The addition of process steps that must be performed at elevated temperatures may cause detrimental effects to components or devices manufactured as part of an integrated circuit. For example, where particular regions of a substrate material are doped with ions (e.g., boron or phosphorous ions), elevated temperatures may result in diffusion of the implanted ions into adjacent regions in the substrate, thus reducing the effectiveness of the doped regions. Further, etch materials such as high-k dielectric materials cannot tolerate high thermal budgets.

Thus, there is a need to form structures in an integrated circuit using an improved method that produces structures having reduced critical dimensions. Further, there is a need to improve the shape integrity of structures formed during manufacturing (e.g., reducing or eliminating conductive line warpage, etc.). Even further, there is a need to use a mask material that may be deposited at a temperature that does not adversely increase the thermal budget of processing. Even further still, there is a need to use diamond as a mask in the formation of integrated circuit structures. Yet further, there is a need for a mask which can be created with a low thermal budget and which can be readily removed.

SUMMARY OF THE INVENTION

An exemplary embodiment relates to a method for producing an integrated circuit. The method includes providing a diamond layer above a layer of conductive material and providing a cap layer above the diamond layer. The method also includes patterning the cap layer to form a cap feature, patterning the diamond layer according to the cap feature to form a mask, and removing at least a portion of the layer of conductive material according to the mask.

Another exemplary embodiment relates to a method of forming features in an integrated circuit. The method includes depositing a layer including carbon having a generally diamond cubic crystallographic structure above a layer of polysilicon. The method also includes depositing a layer of anti-reflective coating (ARC) material over the layer including carbon and removing a portion of the layer including diamond to form a mask feature. The method further includes etching the layer of polysilicon according to the mask feature and removing the mask feature.

A further exemplary embodiment relates to an integrated circuit manufactured by a method that includes providing a layer of conductive material above a semiconductor substrate and providing a layer comprising diamond material above the layer of conductive material. The method also includes providing a layer of anti-reflective coating (ARC) material above the layer comprising diamond material and removing a portion of the layer of ARC material to form an ARC feature. The method further includes removing a portion of the layer comprising diamond material according to the ARC feature to form a diamond mask and etching the layer of conductive material according to the diamond mask to form a conductive line.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
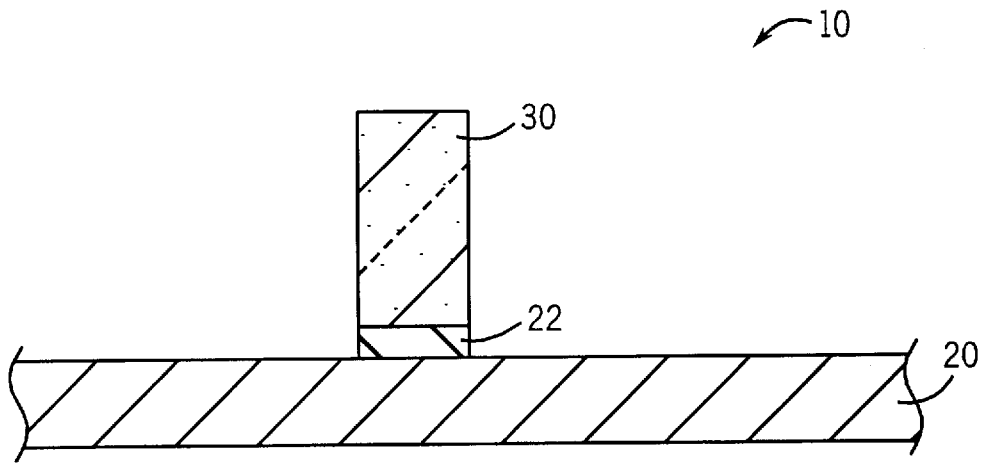
FIG. 1 is a schematic cross-sectional view of a portion of an integrated circuit fabricated in accordance with an exemplary embodiment.

Referring to FIG. 1, a portion 10 of an integrated circuit (IC) includes a substrate layer 20, an oxide or dielectric layer 22, and a line or gate conductor 30. Portion 10 is preferably part of an ultra-large-scale integrated (ULSI) circuit having a million or more transistors, and is manufactured as part of the IC on a wafer made of a semiconducting material (e.g., silicon, gallium arsenide, etc.).

Conductive line 30 can be a metal, a polysilicon, or polysilicon/germanium ($Si_xGe_{(1-x)}$) material that controls charge carriers in a channel region formed between source and drain regions in substrate 20 to turn the transistor on and off. Conductive line 30 may be doped or undoped. In an exemplary embodiment, conductive line 30 is made of a polysilicon material and has a thickness between approximately 500 and 2000 angstroms and a width of between approximately 30 and 50 nanometers.

Figures 2A, 2B:
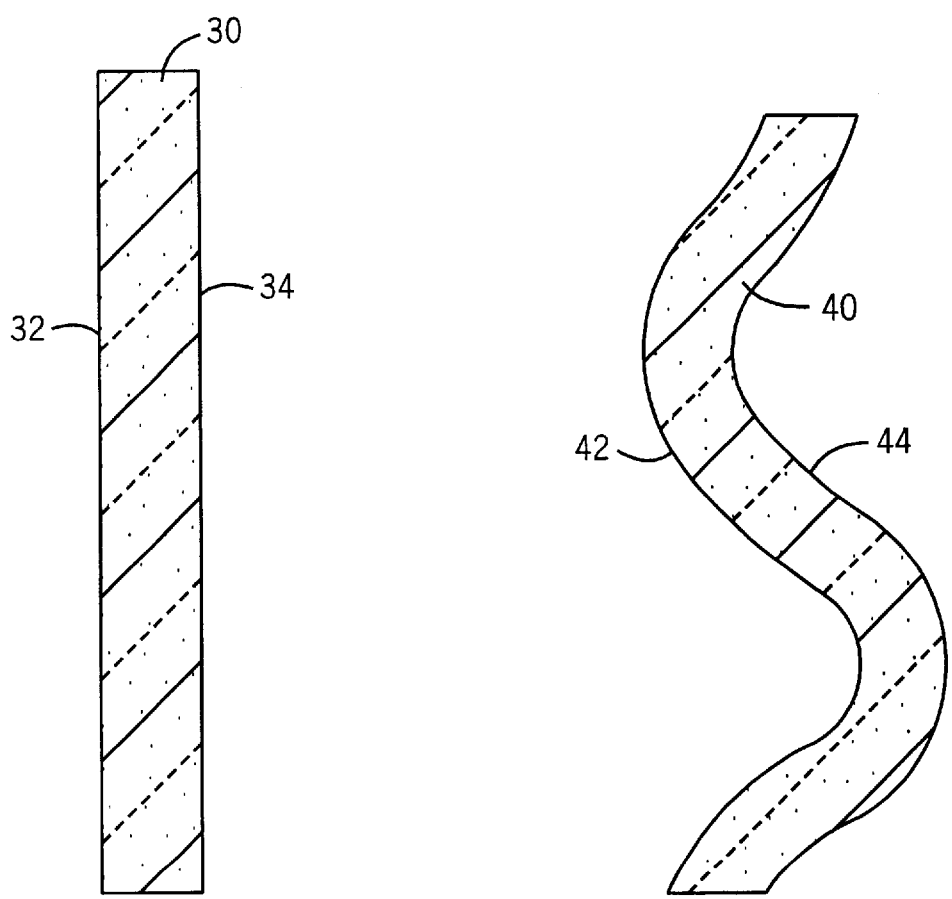
FIG. 2A is a top elevation view of the integrated circuit portion shown in FIG. 1 showing a feature formed without warpage.
FIG. 2B is a top elevation view of a feature similar to that shown in FIG. 2A showing a warpage phenomenon.

As shown in the exemplary embodiment of FIG. 2A, conductive line 30 is preferably formed using a method that maintains the shape integrity of structures formed by reducing or eliminating the phenomenon of warpage or "wiggle." In an example of a conductive line formed in an integrated circuit, one result is that the tendency to form conductive lines having a generally serpentine or curved shape along their length is reduced or eliminated.

The warpage phenomenon may be illustrated with reference to FIGS. 2A and 2B. In manufacturing integrated circuits, it is desirable to produce conductive lines that have a generally straight profile. One example of such a conductive line is shown in FIG. 2A, where the sides or lateral edges 32, 34 of conductive line 30 have a substantially straight or linear configuration along their length. In contrast to conductive line 30, FIG. 2B shows a conductive line 40 manufactured by a method that does not reduce or eliminate warpage along the length of conductive line 40. As shown, sides or edges 42, 44 are not linear, but rather include a generally curved or warped shape. The amount or magnitude of curvature may vary depending on various conditions, including the properties of the mask or patterning material used, the properties of the material being patterned or etched, and the processing conditions used during the etching operation, among others.

A method for producing portion 10 that reduces or eliminates warpage in the formation of conductive line 30 will now be described with reference to FIGS. 3 to 8. FIG. 9 is a flow diagram that outlines the process 200 used in the formation of portion 10.

Figure 3:
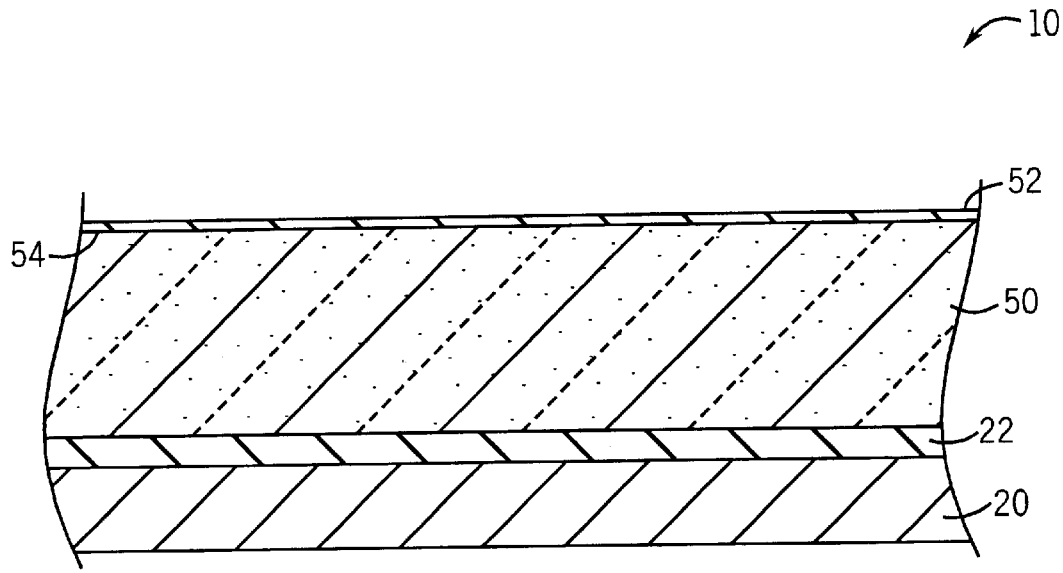
FIG. 3 is a schematic cross-sectional view of the portion shown in FIG. 1 illustrating a polysilicon deposition step.

In a step 210 illustrated in FIG. 3, a layer 50 of conductive or semiconductive material is provided above or over a layer 22 of dielectric material, which is in turn provided above a silicon wafer 20. Layer 50 may be any of a variety of materials suitable for use in a conductive line or gate structure (e.g., metal, polysilicon, polysilicon/germanium ($Si_xGe_{(1-x)}$), etc.) and may be doped or undoped. Layer 22 may be any of a variety of materials suitable for use as a gate dielectric material (e.g., silicon dioxide, silicon nitride, etc.). In an exemplary embodiment, layer 50 is polysilicon and layer 22 is silicon dioxide thermally grown on silicon substrate 20. In an alternative embodiment, layer 50 may include multiple layers of material, one or more of which may include polysilicon.

In an exemplary embodiment, layer 50 has a thickness of between approximately 1,500 and 2,000 angstroms and layer 22 has a thickness of between approximately 50 and 200 angstroms. In an alternative embodiment, layer 50 has a thickness of between approximately 1,000 and 2,500 angstroms and layer 22 has a thickness of approximately 10 and 200 angstroms. Alternatively, layer 22 can be other types of materials used in the formation of narrow lines or structures.

When layer 50 is formed, a thin layer 52 of oxide forms on the top or upper surface 54 of polysilicon layer 50. Oxide layer 52 may be referred to as a "native" oxide layer. The thickness of oxide layer 52 may vary depending on various processing conditions. In an exemplary embodiment, the thickness of oxide layer 52 is between approximately 50 and 200 angstroms.

Figure 4:
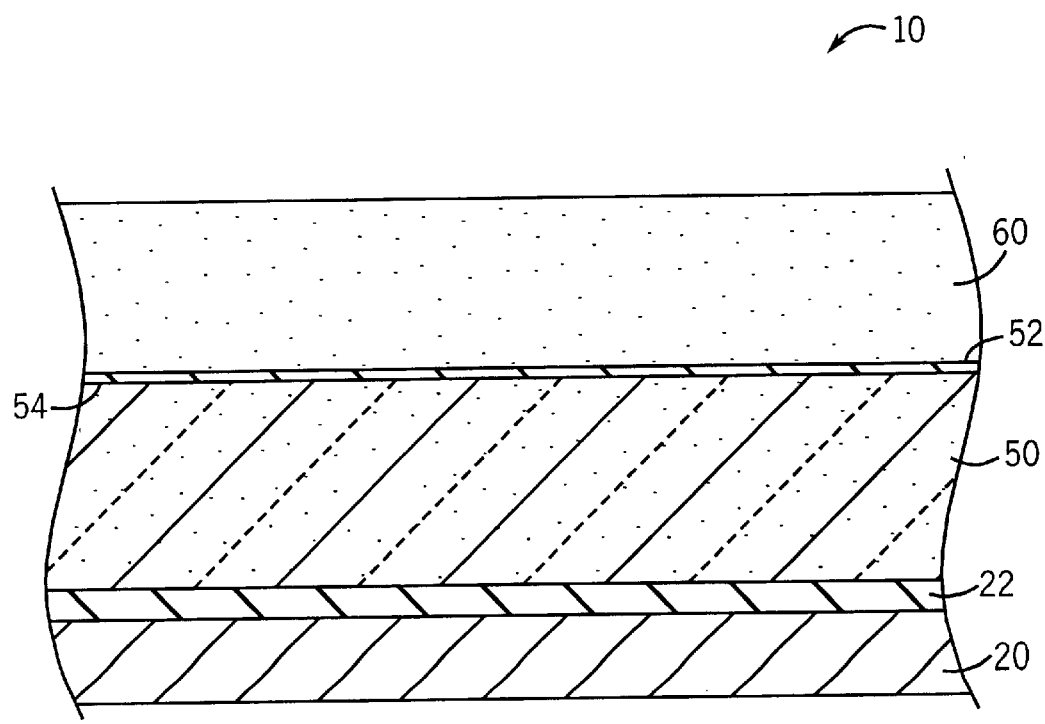
FIG. 4 is a schematic cross-sectional view of the portion shown in FIG. 1 illustrating a diamond layer deposition step.

In a step 220 shown in FIG. 4, a layer or film 60 of diamond-like material is deposited above or over polysilicon layer 50. Diamond is one of several polymorphic forms of carbon, and is characterized by a diamond cubic crystalline structure in which each carbon atom bonds to four other carbon atoms. Layer 60 may have a polycrystalline or single crystalline microstructure. Further, although layer 60 is described as a diamond layer in the disclosure and the claims, it may contain defects and other portions or regions that do not exhibit continuous diamond cubic crystallographic structure. For example, impurities of amorphous carbon and/or graphite forms of carbon may be included in some amounts (e.g., an impurity concentration between approximately 5 and 25 atomic percent). For ease of description, layer 60 may be referred to below simply as a diamond layer.

Layer 60 is deposited in a plasma-enhanced chemical vapor deposition (PECVD) process using an atmosphere including one or more hydrocarbons such as ethylene, propylene, methane, and the like. The PECVD process is performed at a temperature of between approximately 250° and 800° C. and a pressure of between approximately 2 and 30 torr with a plasma power of between approximately 100 and 2000 watts. Increasing the temperature, pressure, and/or power increases the diamond-like structure of layer 60.

One advantageous feature of using a diamond material to form layer 60 is that diamond may be deposited in a vapor deposition process at temperatures lower than comparable films (e.g., at temperatures approaching room or ambient temperature). For example, the amorphous form of carbon is deposited at elevated temperatures of between approximately 400° and 550° C. In this manner, layer 60 may be deposited without significantly increasing the overall thermal budget of processing.

Using a diamond material for layer 60 also provides several additional advantageous features. For example, the microstructure of the diamond form of carbon provides a film having improved shape integrity, which allows processing of integrated circuits having fewer defects. Additionally, the diamond form of carbon has a relatively high thermal conductivity, which allows the use of a relatively low temperature thermal anneal to relieve internal stresses that may be initially present in the diamond film without adversely increasing the overall thermal budget. Further, a diamond material may have an internal stress profile that results in a lesser amount of stress mismatch between the diamond film and adjacent material layers (e.g., adjacent polysilicon or anti-reflective coating materials). As a result, features such as conductive lines may be produced in a manner that reduces or eliminates warpage or wiggle.

In a preferred embodiment, diamond layer 60 has a thickness of between approximately 100 and 1500 angstroms. In alternative embodiments, the thickness of diamond layer 60 may vary depending on various design considerations. For example, the diamond layer may have a thickness of less than 200 angstroms (e.g., between 100 and 200 angstroms or less). In another alternative embodiment, the diamond layer may have a thickness of greater than 1000 angstroms (e.g., between 1000 and 1500 angstroms or greater).

One advantageous feature of providing a diamond layer that may be produced with various thicknesses is that the diamond layer may be produced in a thickness suitable for patterning polysilicon layer 50. For example, where a particular thickness of polysilicon is provided, the thickness of the diamond layer may be altered so that the proper amount of mask material is provided over the polysilicon material to compensate for the etch selectivities of the materials used. This allows for increased manufacturing efficiency by eliminating unnecessary material use.

In an alternative embodiment, the diamond layer may be deposited with nitrogen incorporated therein or may be implanted with nitrogen after deposition. For example, the diamond layer as deposited may include between approximately 0 and 10 atomic percent nitrogen. In alternative embodiments, various other nitrogen concentrations may be achieved by varying the various processing conditions (e.g., increasing or decreasing the gas flow ratio of adjust the level of nitrogen, etc.).

Figure 5:
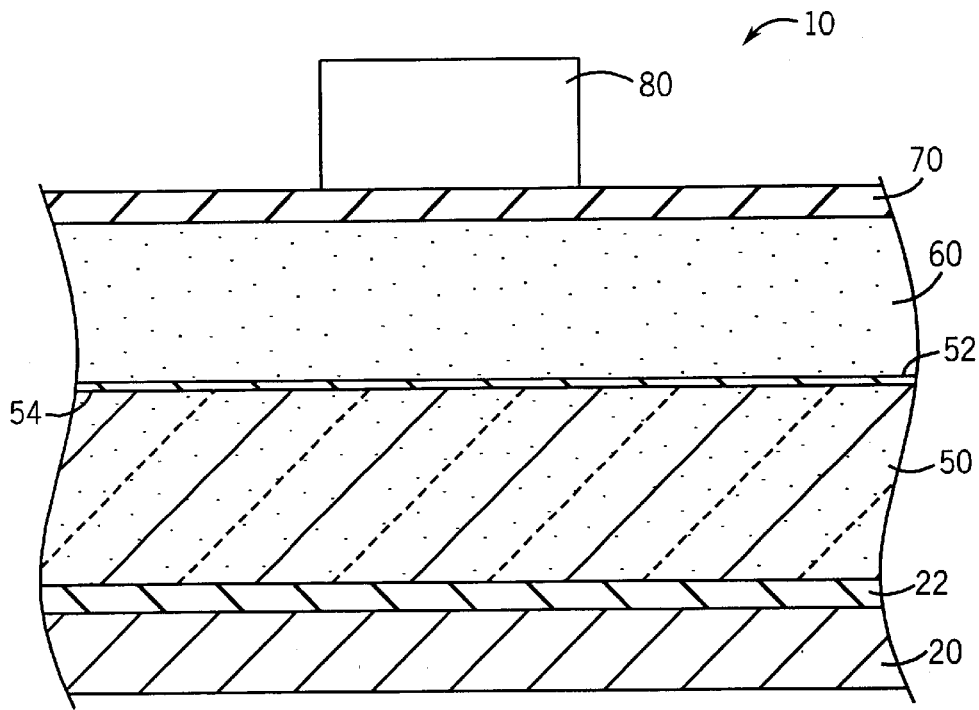
FIG. 5 is a schematic cross-sectional view of the portion shown in FIG. 1 illustrating an anti-reflective coating (ARC) layer deposition and mask formation step.

In a step 230 shown in FIG. 5, a cap layer 70 is deposited above or over diamond layer 60. Cap layer 70 may be formed of an anti-reflective material to form an anti-reflective coating (ARC) layer. Cap layer 70 may be include silicon nitride (SiN), silicon oxynitride (SiON), silicon-rich oxide (e.g., non-stoichiometric oxide-containing silicon material), silicon-rich nitride, and the like. In an exemplary embodiment, Cap layer 70 has a thickness of between approximately 200 and 250 angstroms. One advantageous feature of using a cap layer formed from an anti-reflective material is that the diamond layer will be protected during deposition and exposure of a photoresist material above diamond layer 60 and that reflection of ultraviolet (UV) rays used in the exposure of the photoresist will be reduced.

In a step 240, a layer of photoresist material is deposited above or over cap layer 70 (e.g., by spin-coating) and exposed to form a photoresist feature 80. The layer of photoresist is deposited at a thickness of between approximately 200 and 400 angstroms and is patterned to have a width of between approximately 300 and 800 angstroms. Any of a variety of photoresist materials may be used, including photoresist materials that may be etched using UV rays having wavelengths of 193 or 248 nanometers.

Figure 6:
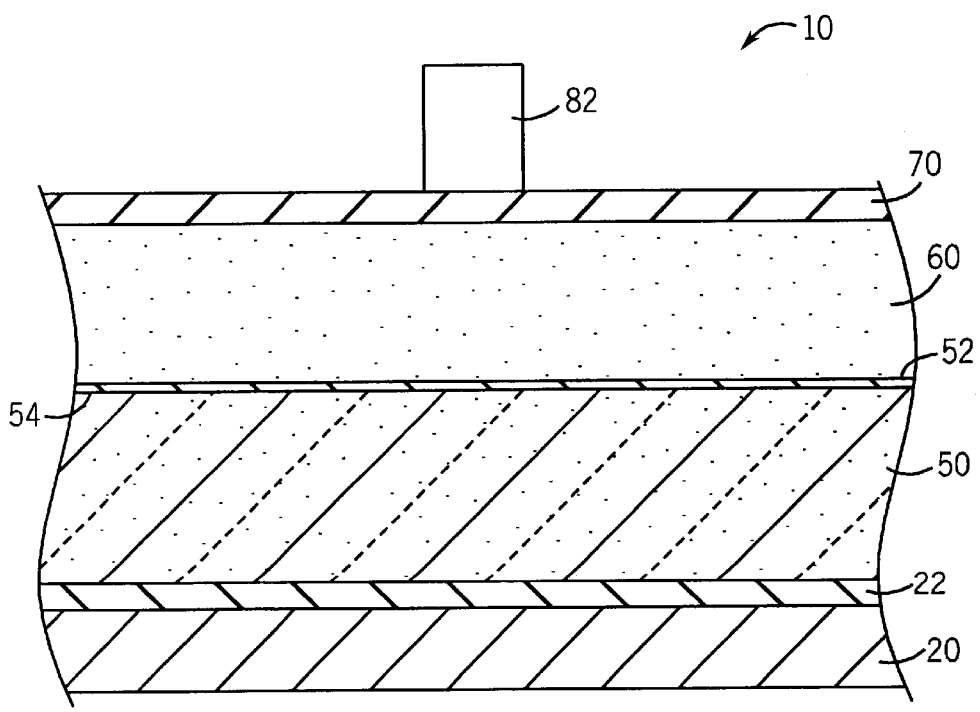
FIG. 6 is a schematic cross-sectional view of the portion shown in FIG. 1 illustrating a mask trimming step.

In a step 250 shown in FIG. 6, photoresist feature 80 is trimmed to form a photoresist mask 82 having reduced dimensions. Trimming is accomplished by oxidizing the photoresist feature and removing the oxidized portion, which results in a photoresist mask having reduced dimensions. The thickness of the photoresist mask formed may depend on the trim rate. For example, in an exemplary embodiment, a trim etching step may erode or remove between approximately 3 to 4 nanometers per second in the vertical direction and between approximately 1.5 and 2.5 nanometers per second in the lateral direction. Other trim rates may be used, and may depend on the type of photoresist material used. Process 200 is particularly advantageous when narrow gate conductors are formed when using trim etching techniques. In an exemplary embodiment, photoresist mask 82 has a thickness of between approximately 2000 and 8000 angstroms and a width of approximately 30 and 80 nanometers after trim etching.

Figure 7:
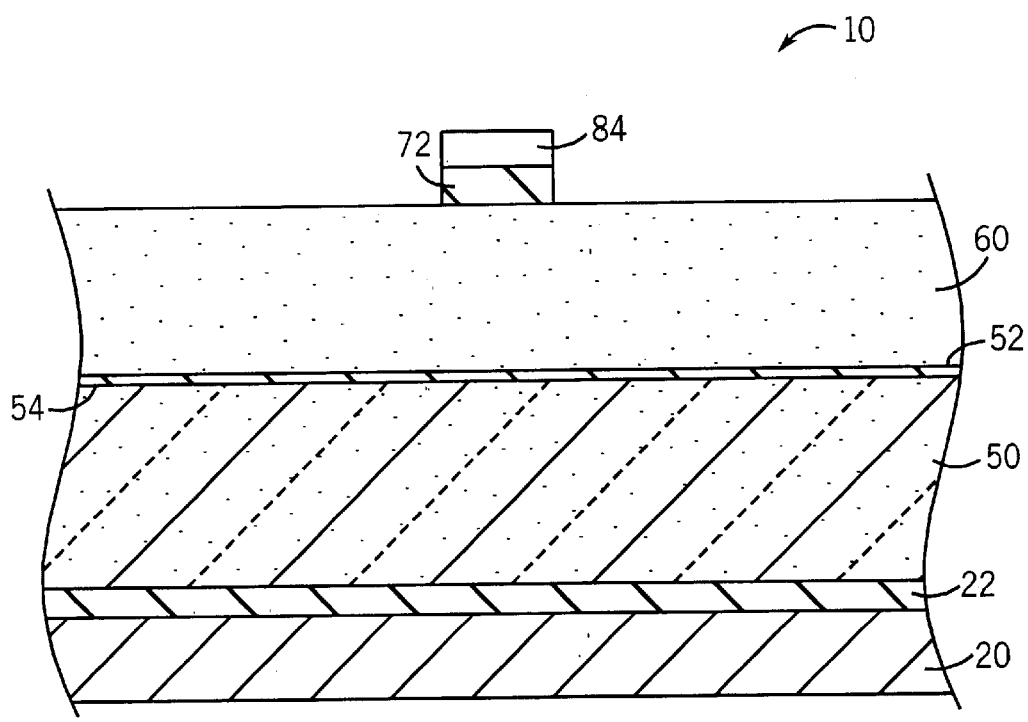
FIG. 7 is a schematic cross-sectional view of the portion shown in FIG. 1 illustrating the formation of a mask for patterning a diamond layer.

In a step 260 shown in FIG. 7, photoresist mask 82 is used as a mask to pattern cap layer 70 to form a cap feature 72. A small amount of photoresist material 84 remains through the etching and overetching of cap layer 70. In an exemplary embodiment, cap layer 70 is etched using a fluorine-based plasma (e.g., $CF_4$, $CF_4/CHF_3$, etc.). The etching is performed in an argon or helium atmosphere at a temperature of approximately 20° C. and a pressure of approximately 20 millitorr.

Figure 8:
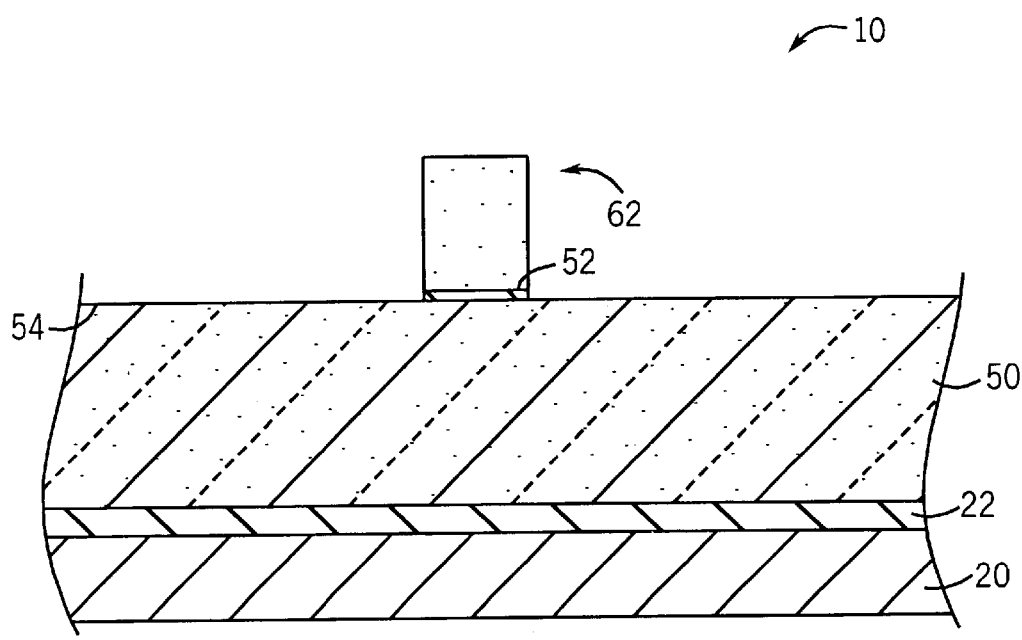
FIG. 8 is a schematic cross-sectional view of the portion shown in FIG. 1 illustrating the formation of a diamond mask feature.
Figure 9:
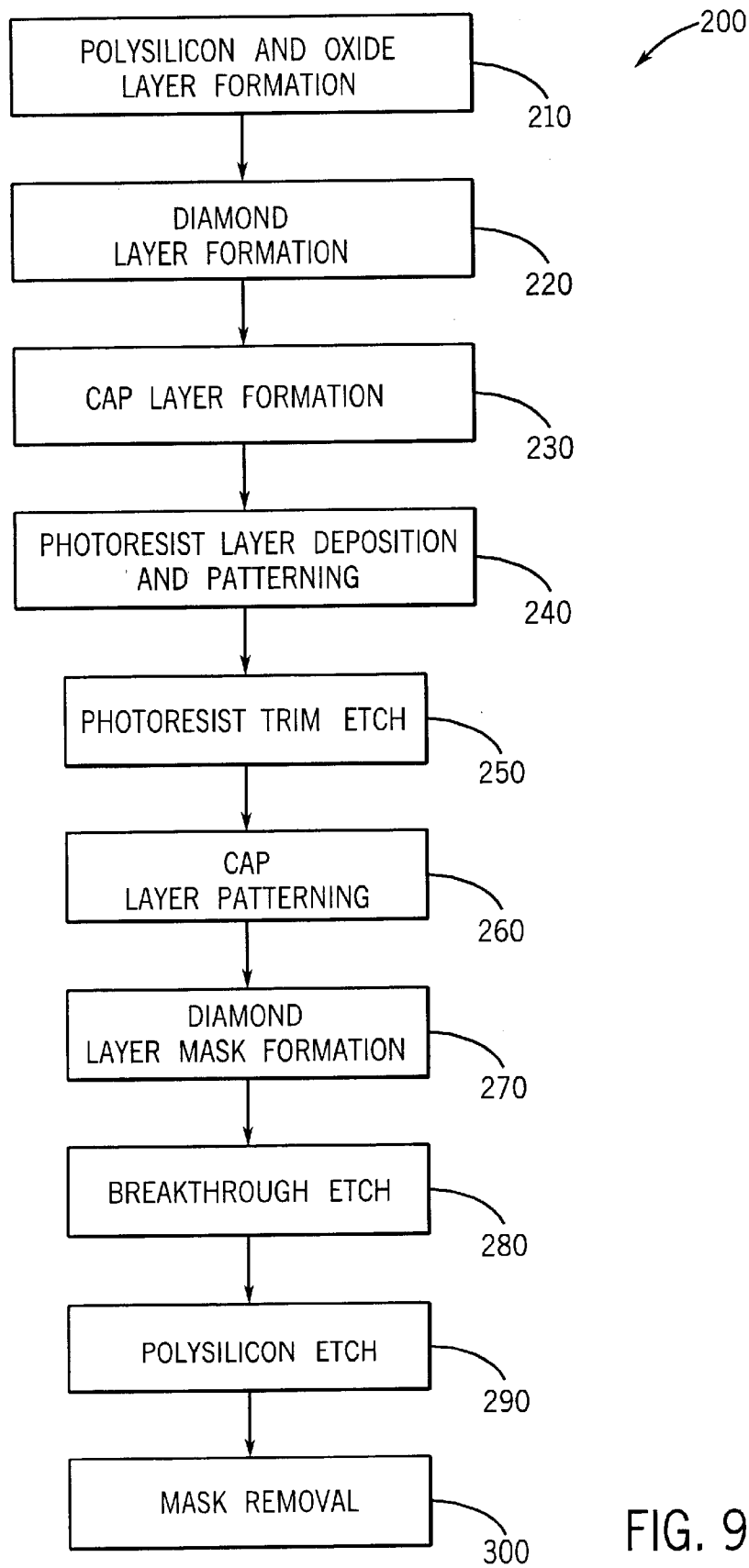
FIG. 9 is a flow diagram illustrating the process of forming structures in an integrated circuit.

In a step 270 shown in FIG. 8, a diamond mask or mask feature 62 is formed using cap feature 72 as a mask to pattern diamond layer 60. In an exemplary embodiment, diamond layer 60 is etched using an oxygen-based plasma at a temperature of between approximately −10° and 50° C. and a pressure of between approximately 10 and 80 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 100 and 500 watts and the ion energy control is between approximately 50 and 200 watts.

In an exemplary embodiment, diamond mask 62 has a width of between approximately 30 and 60 nanometers. Using the plasma etch method described above, diamond mask 62 is formed without the introduction of aqueous etchants, which may damage or destroy mask 62 as processing proceeds. For example, the use of phosphoric acid as an etchant is eliminated by using a mask layer of diamond, since portions of the diamond layer may be removed using a plasma etch.

In a step 280, a breakthrough or native oxide removal etch is performed to remove oxide layer 52 from the surface 54 of polysilicon layer 50 prior to patterning polysilicon layer 50. The breakthrough etch also removes any remaining photoresist and cap material located on top of cap layer 72. The breakthrough etch step is performed using the same conditions as described above with respect to the cap etch (e.g., using a fluorine-based plasma).

In a step 290, diamond mask 62 is used to pattern or form features in polysilicon layer 50. For example, polysilicon layer 50 may be etched to form conductive line 30 (shown in FIG. 1). The polysilicon etch is performed using an $HBr/Cl_2/HeO_2/CF_4$ mixture at a temperature of between approximately 40 and 70° C. and a pressure of between approximately 3 and 10 millitorr.

In a step 300, diamond mask 62 is removed after polysilicon layer 50 is patterned (e.g., to form conductive line 30 shown in FIG. 1). The diamond mask may be removed using a method similar to that described above, in which an oxygen-containing plasma may be used to remove or "ash" away the diamond mask to expose the top surface of conductive line 30. In subsequent processing steps, other material layers and devices may be added to portion 10 to form a complete integrated circuit.

While the exemplary embodiments illustrated in the FIGURES and described above are presently preferred, it should be understood that these embodiments are offered by way of example only. Other embodiments may include, for example, different methods of depositing the various layers above the substrate, different combination of times, temperatures, pressures, and the like. The invention is not limited to a particular embodiment, but extends to various modifications, combinations, and permutations that nevertheless fall within the spirit and scope of the appended claims.

What is claimed is:

1. A method for producing an integrated circuit comprising:
   providing a diamond layer above a layer of conductive material;
   providing a cap layer above the diamond layer;
   patterning the cap layer to form a cap feature;
   patterning the diamond layer according to the cap feature to form a mask; and
   removing at least a portion of the layer of conductive material according to the mask.

2. The method of claim 1, wherein the diamond layer has a thickness of between approximately 100 and 1500 angstroms.

3. The method of claim 1, wherein the step of providing a diamond layer comprises using a plasma-enhanced chemical vapor deposition (PECVD) process.

4. The method of claim 1, wherein the diamond layer is deposited at a temperature of between approximately 250 and 800° C.

5. The method of claim 1, wherein the step of patterning the diamond layer comprises etching the diamond layer using an oxygen-based plasma.

6. The method of claim 1, wherein the conductive material is polysilicon.

7. The method of claim 1, wherein the cap layer comprises an anti-reflective coating (ARC) material including at least one of silicon nitride, silicon oxynitride, silicon-rich oxide, and silicon-rich nitride.

8. The method of claim 1, wherein the step of patterning the cap layer comprises providing a layer of photoresist material over the cap layer, exposing the layer of photoresist material to form a photoresist mask, and patterning the cap layer in accordance with the photoresist mask.

9. A method of forming features in an integrated circuit comprising:
   depositing a layer including carbon having a generally diamond cubic crystallographic structure above a layer of polysilicon;
   depositing a layer of anti-reflective coating (ARC) material over the layer including carbon;
   removing a portion of the layer including diamond to form a mask feature;
   etching the layer of polysilicon according to the mask feature; and
   removing the mask feature.

10. The method of claim 9, wherein the layer including carbon is deposited using a plasma-enhanced chemical vapor deposition (PECVD) process.

11. The method of claim 10, wherein the layer including carbon is deposited at a temperature of between approximately 250° and 800° C. and a pressure of between approximately 2 and 30 torr.

12. The method of claim 9, wherein the step of removing a portion of the layer including carbon comprises etching the layer including carbon using an oxygen-based plasma.

13. The method of claim 9, wherein the layer including carbon has a thickness of between approximately 100 and 1500 angstroms.

14. The method of claim 9, wherein the mask feature has a width of between approximately 30 and 50 nanometers.

15. The method of claim 14, wherein the layer of polysilicon has a thickness of between approximately 1,500 and 2,000 angstroms.

16. The method of claim 9, wherein the ARC material comprises at least one of silicon nitride, silicon oxynitride, silicon-rich oxide, and silicon-rich nitride.

17. An integrated circuit manufactured by a method comprising:

providing a layer of conductive material above a semiconductor substrate;

providing a layer comprising diamond material above the layer of conductive material;

providing a layer of anti-reflective coating (ARC) material above the layer comprising diamond material;

removing a portion of the layer of ARC material to form an ARC feature;

removing a portion of the layer comprising diamond material according to the ARC feature to form a diamond mask; and etching the layer of conductive material according to the diamond mask to form a conductive line.

18. The integrated circuit of claim 17, wherein the layer comprising diamond material has a thickness of between 100 and 1500 angstroms and is deposited at a temperature of between approximately 250° and 800° C.

19. The integrated circuit of claim 17, wherein the conductive line comprises polysilicon and has a width of between approximately 30 and 50 nanometers.

20. The integrated circuit of claim 17, wherein the step of removing a portion of the layer comprising diamond material comprises using an oxygen-based plasma.

* * * * *